United States Patent
Bardouillet et al.

(10) Patent No.: US 7,199,631 B2
(45) Date of Patent: *Apr. 3, 2007

(54) STORING AN UNCHANGING BINARY CODE IN AN INTEGRATED CIRCUIT

(75) Inventors: Michel Bardouillet, Rousset (FR); Luc Wuidart, Pourrieres (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/473,057

(22) PCT Filed: Apr. 4, 2002

(86) PCT No.: PCT/FR02/01193

§ 371 (c)(1),
(2), (4) Date: Feb. 10, 2004

(87) PCT Pub. No.: WO02/082449

PCT Pub. Date: Oct. 17, 2002

(65) Prior Publication Data

US 2004/0130363 A1 Jul. 8, 2004

(30) Foreign Application Priority Data

Apr. 4, 2001 (FR) .................................. 01 04583

(51) Int. Cl.
*H03L 7/00* (2006.01)

(52) U.S. Cl. ...................................... 327/161; 327/269

(58) Field of Classification Search ........ 327/141–144, 327/152–153, 161, 395, 400, 261–263, 284, 327/293, 269, 271; 377/64, 73, 76, 78
See application file for complete search history.

(56) References Cited

U.S. PATENT DOCUMENTS

| 3,911,368 | A | 10/1975 | Tarczy-Hornoch | |
|---|---|---|---|---|
| 4,023,110 | A | 5/1977 | Oliver | |
| 4,595,992 | A * | 6/1986 | Drogin | 702/79 |
| 4,675,612 | A | 6/1987 | Adams | |
| 5,204,559 | A | 4/1993 | Deyhimy | |
| 5,329,280 | A * | 7/1994 | Amuro | 341/96 |
| 5,608,645 | A | 3/1997 | Spyrou | |
| 5,686,850 | A | 11/1997 | Takaki | |
| 6,222,894 | B1 * | 4/2001 | Lee | 375/376 |
| 2001/0050952 | A1 | 12/2001 | Nikutta | |
| 2004/0125930 | A1 | 7/2004 | Bardouillet et al. | |

FOREIGN PATENT DOCUMENTS

DE 19510038 C 8/1996

OTHER PUBLICATIONS

International Search Report from the corresponding International Application No. PCT/FR02/01193.

* cited by examiner

*Primary Examiner*—My-Trang Nu Ton
(74) *Attorney, Agent, or Firm*—Lisa K. Jorgenson; James H. Morris; Wolf, Greenfield & Sacks, P.C.

(57) ABSTRACT

The invention concerns a circuit (1) for storing a binary code (B1, B2, Bi-1, Bi, Bn-1, Bn) in an integrated circuit chip, comprising an input terminal (2) applying a signal (E) triggering reading of the code, output terminals (31, 32, 3i-1, 3i, 3n-1, 3n) for delivering said binary code, first electrical paths (P1, P2, Pi, Pn) individually connecting said input terminal to each output terminal, each path inputting a fixed delay in the manufacture of the integrated circuit, and means (4, 51, 52, 5i, 5n) simultaneously integrating the binary states present in output of the electrical paths.

20 Claims, 1 Drawing Sheet

STORING AN UNCHANGING BINARY CODE IN AN INTEGRATED CIRCUIT

BACKGROUND OF THE INVENTION

1. Field of the Invention

The present invention relates to the storage, in an integrated circuit, of a permanent binary code. The present invention more specifically applies to the writing, in the circuit manufacturing, of a permanent code intended to be read, upon use of the integrated circuit, to identify the circuit, or more specifically a circuit family.

2. Discussion of the Related Art

An example of application of the present invention is the authentication of an electronic element or assembly containing such an integrated circuit (for example, a smart card with or without contacts), in transactions or information exchanges with another element (for example, a card reading terminal). In such applications, it must be ensured that the integrated circuit is authentic and is not a pirate circuit or an emulated circuit. In particular, in the field of smart cards, it is currently difficult to fight against a large scale piracy consisting of manufacturing pirate cards (clones) identical to authentic cards, that is, integrating the same circuits made by similar technological processes.

Among these applications, the present invention more specifically relates to those where a permanent code common to several circuits is desired to be written. It may be, for example, an identifier of the manufacturer, an identifier of the original value of a prepaid count unit card (telephone unit cards), etc.

Memories or registers embedded in the integrated circuit are currently used to store this or these codes. The code is written in a non-modifiable manner in the storage element before or after manufacturing.

A disadvantage of such a technique is that it requires a visible programming, making the code detectable out of the circuit operation. Indeed, whether the code written upon manufacturing or by subsequent definitive programming, the fuse-type elements having been used for this writing are then visually identifiable. The progress made in terms of integrated circuit optical analysis then enables piracy of the code.

Another disadvantage of such a technique is that the subsequent circuit authentication, upon its use, requires a storage element read process, which takes time.

SUMMARY OF THE INVENTION

The present invention aims at providing a novel solution for storing a binary code in an integrated circuit.

The present invention more specifically aims at enabling storage of a code which cannot be visually detected, even with high-performance optical detection means.

The present invention also aims at providing a solution which provides the stored code without requiring a memory reading type procedure, and in an almost instantaneous manner.

The present invention also aims at providing a solution requiring no circuit programming after manufacturing.

The present invention further aims at providing a solution which is particularly simple to implement.

To achieve these and other objects, the present invention provides a circuit for storing a binary code in an integrated circuit chip, including:

an input terminal for application of a signal for triggering a reading of the code;

output terminals adapted to providing said binary code;

first electric paths individually connecting said input terminal to each output terminal, each path introducing a delay set upon manufacturing of the integrated circuit; and means for simultaneously taking into account binary states present at the outputs of the electric paths.

According to an embodiment of the present invention, each first electric path is formed of a delay element and of a flip-flop having an input terminal connected at the output of the corresponding delay element and having an output terminal defining one of the output terminals of the circuit.

According to an embodiment of the present invention, said means for taking into account include a second electric path introducing a delay included in the range of the delays introduced by said first paths, said second path being interposed between said input terminal and a terminal for triggering the taking into account of said binary states.

According to an embodiment of the present invention, the clock inputs of the different flip-flops are all connected to said triggering terminal.

According to an embodiment of the present invention, the first electric paths are chosen to introduce delays which remain shorter or longer than the delay of the second path, despite possible technological dispersions.

The foregoing objects, features and advantages of the present invention, will be discussed in detail in the following non-limiting description of specific embodiments in connection with the accompanying drawings, in which:

DETAILED DESCRIPTION

Figure 1:
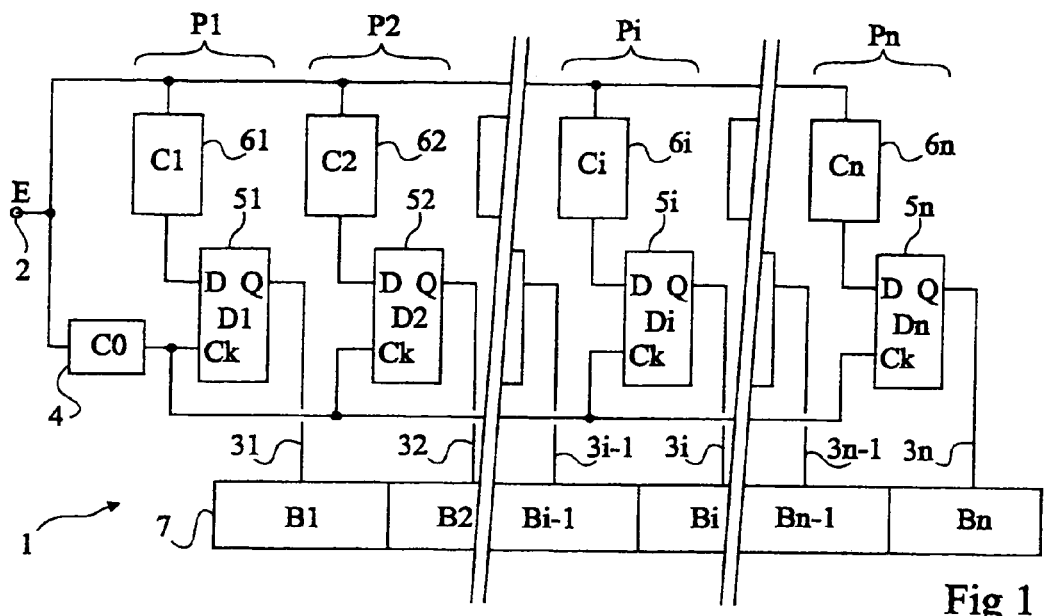
FIG. 1 shows an embodiment of an integrated storage circuit according to the present invention.

For clarity, only those elements which are necessary to the understanding of the present invention have been shown in the drawings and will be described hereafter. In particular, the destination and the exploitation of the stored binary code have not been described in detail.

A feature of the present invention is to store a binary code by means of physical parameters of the actual integrated circuit. More specifically, the present invention provides submitting a same input signal (a logic signal including at least one edge) to several different delays coming from distinct electric paths.

Another feature of the present invention is to provide direct comparison of the delays introduced by the different paths with respect to an intermediary delay, to make the code delays insensitive to technological and/or manufacturing process variations.

FIG. 1 shows the electric diagram of an embodiment of an integrated storage circuit according to the present invention.

In this example, circuit 1 includes a single input terminal 2 intended to receive a digital signal E for triggering a code reading. According to the present invention, signal E alone is sufficient for the code to be provided. To implement the present invention, signal E must include, as will be seen hereafter in relation with FIGS. 2A and 2B, at least one edge per triggered reading.

Circuit 1 provides a binary code $B_1, B_2, \ldots, B_{i-1}, B_i, \ldots, B_{n-1}, B_n$ over a predetermined number of bits. Each bit $B_i$ is provided on a terminal $3_1, 3_2, \ldots, 3_{i-1}, 3_i, \ldots, 3_{n-1}$, $3_n$ of circuit 1 which is specific to it. Circuit 1 thus provides the binary code in parallel form.

According to the present invention, to each bit $B_i$ of the code is associated an electric path $P_1, P_2, \ldots, P_i, \ldots, P_n$ connecting common input terminal 2 to a terminal $3_i$ of same rank.

It can thus already be seen that, by the different delays introduced by the electric paths, the edge triggering input signal E is reproduced on the different outputs at different times.

According to the present invention, the information present at the outputs of circuit 1 is read in a synchronized way. Preferably, a time approximately corresponding to an intermediary time between the shortest and longest delays introduced by the different electric paths is chosen.

More specifically, according to the embodiment of the present invention illustrated in FIG. 1, an electric path 4 (C0) is provided to set the read time from the occurrence of the edge triggering input signal E. This electric triggering path is chosen to introduce a delay included in the range of delays due to the paths providing the code. It may, for example, be the average delay.

For example, path 4 connects input 2 of circuit 1 to the terminals Ck of flip-flops $5_1, 5_2, \ldots, 5_i, \ldots, 5_n$ belonging to respective electric paths $P_1, P_2, \ldots, P_i, \ldots, P_n$ and the respective Q outputs of which form output terminals $3_1, 3_2, \ldots, 3_i, \ldots, 3_n$ of circuit 1. According to this embodiment, each electric path $P_i$ includes a delay element $6_1$ (C1), $6_2$ (C2) $\ldots, 6_i$ (Ci) $\ldots, 6_n$ (Cn) connecting input 2 of the circuit to the D input of the corresponding flip-flop in the path. Delay elements $6_i$ are the elements exhibiting, according to the present invention, different delays with respect to one another. Indeed, flip-flops $5_i$ preferably have the same structure. They however take part in the delay brought to the input signal until it reaches the respective output terminals of circuit 1 with respect to delay C0 introduced by element 4.

When an edge is applied on input signal E, this edge reaches the respective D inputs of the flip-flops at different times. The reading of the input state of the different flip-flops is synchronized by the edge of signal E delayed, this time, by element 4. For this reason, in particular, a delay C0 approximately corresponding to the average delay of the different elements $6_i$ is chosen.

In the example of FIG. 1, the different outputs $3_i$ of circuit 1 are individually connected at the input of a register 7 for storing the obtained binary code, each bit $B_i$ corresponding to one of the circuit outputs. The connection and structure details of register 7 have not been shown in detail. Once the binary code is contained in this register, its exploitation depends on the application, and its implementation is within the abilities of those skilled in the art.

Figure 2A:
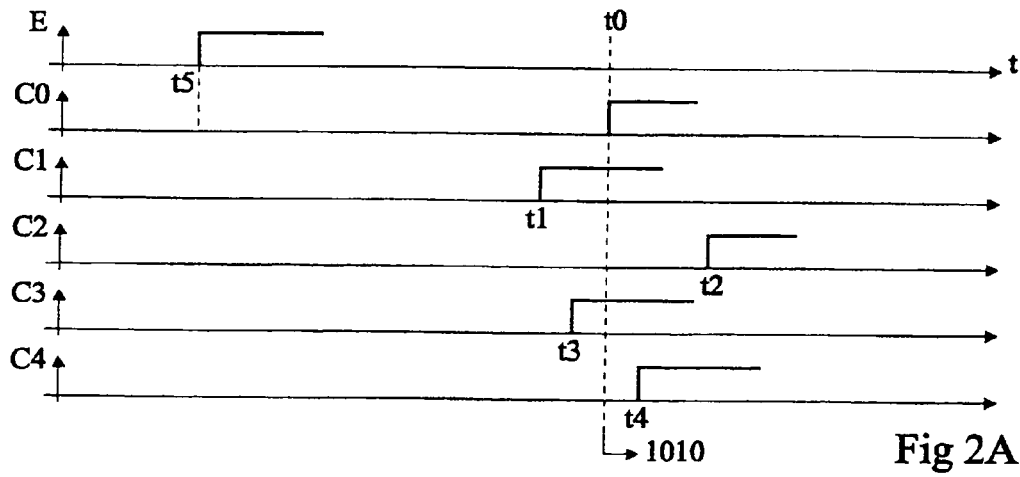
FIGS. 2A and 2B illustrate, in the form of timing diagrams, the operation of the identification circuit of FIG. 1, for two different codes.
Figure 2B:
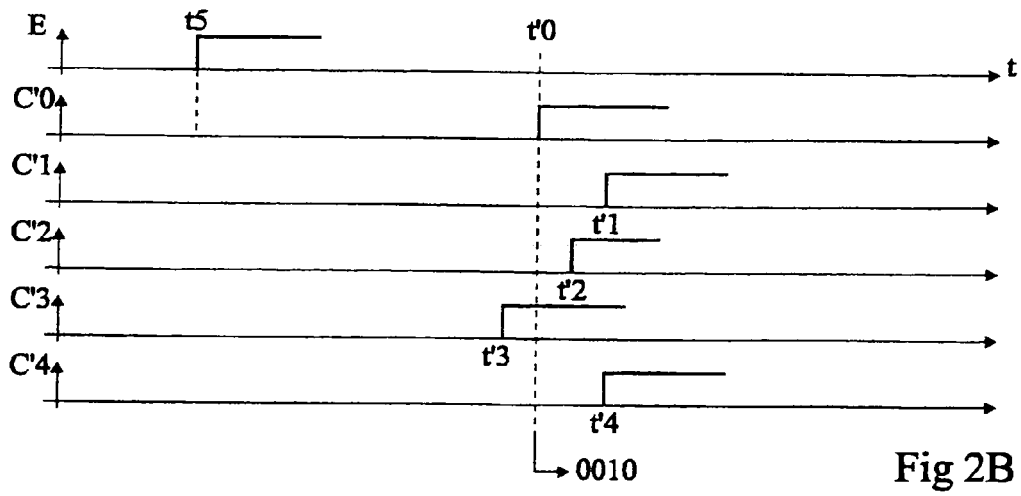

FIGS. 2A and 2B illustrate, in the form of timing diagrams and without any scale consideration, the operation of a storage circuit according to the present invention. FIGS. 2A and 2B show examples of shapes of signal E, and output signals of the different delay elements. In the example of FIGS. 2A and 2B, the case of a binary code over four bits is considered. The timing diagrams have been designated with references C0, C1, C2, C3, and C4, respectively, C'0, C'1, C'2, C'3, and C'4 to illustrate that the delay elements are different therein.

The difference between FIGS. 2A and 2B represents the difference between two integrated circuits 1 having paths C0 to C4 introducing different delays.

In FIG. 2A, it is assumed that at a time t5, a rising edge is triggered on signal E. This edge appears on the different inputs of the D flip-flops (corresponding to the outputs of delay elements C1, C2, C3, and C4) at different respective times t1, t2, t3, and t4. Further, element 4 (C0) introduces a delay starting the data reading at the flip-flop input at a time t0. All paths generating a delay greater than delay C0 provide a bit at state 0 since the edge of signal E has not reached them yet. All paths generating a delay shorter than delay C0 generate a bit at state 1 since the edge of signal E arrives on the input of the corresponding flip-flop before delay C0 has expired. In the example of FIG. 2A, at time t0, code 1010 is provided.

FIG. 2B illustrates a similar circuit in which paths C0' to C4' are different. The code obtained therein is different. For example, it is code 0010. In FIG. 2B, a time t5 identical to the case of FIG. 1 has arbitrarily been shown. However, times t'0, t'1, t'2, t'3, and t'4 at which the edge of signal E is at the end of its way through respective paths C'0, C'1, C'2, C'3, and C'4 are different from the case of FIG. 2A.

Preferably, the delays introduced by the different paths are chosen to be sufficiently different from one another to by insensitive to technological and manufacturing process dispersions. It is thus guaranteed that all the circuits in the same family do provide the same code. Preferably, in the case of more than two paths, said paths are different from one another even if they must provide the same result (0 or 1). This makes a visual distinction between the paths even less exploitable.

To provide a different code from one circuit to another, the electric paths may be modified so that they introduce different delays, or the assigning of the different paths to the different flip-flops may be modified, which modifies the order of the bits in the code. Average delay C0 may also be modified to shift the flip-flop triggering time. In this case, it will be ascertained to have all paths introducing delays which are, with respect to one another, independent from technological variations.

According to an embodiment of the present invention, the code to be stored is predetermined before the circuit manufacturing. In this case, delay elements C1 to Cn and/or element C0 are sized so that the circuit provides this code.

According to another embodiment, the code is unknown upon design of the circuit. It is then identified after manufacturing by a triggering of the reading of the code of one of the circuits in the family. This code is common to all circuits in the family (manufactured with the same masks). It can thus be subsequently exploited, for example, as a code of identification of the circuit type.

It may also be envisaged to individualize the codes of each chip on a same wafer, be it by individualizing the masks or the like, or by providing delays sensitive to technological variations.

An advantage of the present invention is that the stored code cannot be visually detected. Indeed, for the code to appear, it is necessary to apply an electric signal at the input of the circuit of the present invention.

Another advantage of the present invention is that it does not require organizing a read process to extract the code, as is the case in a conventional memory. According to the present invention, it is sufficient to apply an edge on signal E to see the code appear on the output terminals, with a delay depending on the average delay. Cycle time of the system exploiting the integrated circuit is thus saved.

Another advantage of the present invention is that the identification is particularly accurate and reliable. In particular, by eliminating the use of a measurement (memory reading), possible accuracy problems are avoided.

Another advantage of the present invention is that the code provision is very fast. Indeed, manufacturing process or technological variations most often introduce differences on the order of at most some hundred picoseconds. Accordingly, paths introducing delays in a range of a few hundreds of picoseconds are sufficient to provide a code. The code provision time can thus be on the order of one nanosecond.

Another advantage of the present invention is that in case of a drift in time of one of the delays introduced by the elements, this does not alter the circuit results. Indeed, all delay elements being preferably of similar structure, the variation will be in the same direction for all elements (paths).

To form the delay elements of the electric paths of the present invention, any integrated elements may be used. These may be, for example, series of resistors and/or of capacitors, or mere tracks. For the resistors, resistors across the integrated circuit thickness may be used, but it will be preferred to use polysilicon resistors having a value linked to the geometry and which have the advantage of being less temperature-dependent.

According to the present invention, a read phase is triggered by an edge of input signal E. The number of phases depends on the application and on the destination of the identification circuit. If it is a chip card, an identification upon each exchange performed between this card and an external device may be provided, for example, even during the same transaction.

Of course, the present invention is likely to have various alterations, modifications, and improvement which will readily occur to those skilled in the art. In particular, the practical implementation of the delay elements of the present invention may take different forms.

Further, the choice of the variation range of the delays introduced by the different elements depends on the application and on the desired sensitivity. This choice is within the abilities of those skilled in the art based on the functional indications given hereabove.

Further, it should be noted that the number of bits of the code provided by the circuit according to the present invention also depends on the application and on the desired degree of inviolability. The higher the number of bits, the more the distinction between two circuits storing different codes is made difficult.

Further, different elements of binary code exploitation upon circuit use may be provided. Instead of being stored in a register, said code may, for example, be directly exploited to validate or invalidate a function of the circuit in which it is integrated, for example, the supply of this circuit.

Finally, although a preferred embodiment uses a single read triggering signal E, several triggering signals may be provided, especially in the case of a circuit integrating several codes. In such a case, the different codes may or not share a same delay C0.

Among the applications of the present invention, it may be envisaged to use the code as an identifier of the type of circuit for an automated placing of the chips by a robot which previously identifies them by their code.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not as limiting. The invention is limited only as defined in the following claims and the equivalents thereto.

What is claimed is:

1. A circuit for storing a binary code in an integrated circuit chip, including:
   an input terminal for application of a signal for triggering a reading of the binary code;
   output terminals adapted to providing said binary code;
   first electric paths individually connecting said input terminal to each output terminal, each of the first electric paths introducing a delay, wherein a length of the delay encodes at least a portion of the binary code set upon manufacturing of the integrated circuit; and
   means for simultaneously taking into account binary states present at the outputs of the electric paths.

2. The circuit of claim 1, wherein each first electric path comprises a delay element and a flip-flop having an input terminal connected at an output of the corresponding delay element and having an output terminal defining one of the output terminals of the circuit.

3. The circuit of claim 1, wherein said means for taking into account include a second electric path introducing a delay in a range of the delays introduced by said first electric paths, said second path being interposed between said input terminal and a terminal for triggering the taking into account of said binary states.

4. The circuit of claim 1, wherein each first electric path comprises a delay element and a flip-flop having an input terminal connected at an output of the corresponding delay element and having an output terminal defining one of the output terminals of the circuit, wherein said means for taking into account includes a second electric path introducing a delay included in a range of the delays introduced by said first paths, said second path being interposed between said input terminal and a terminal for triggering the taking into account of said binary states, and wherein clock inputs of the different flip-flops are connected to said terminal for triggering.

5. The circuit of claim 3, wherein the first electric paths are chosen to introduce delays which remain shorter or longer than the delay of the second path, despite possible technological dispersions.

6. A circuit for storing a binary code, the binary code comprising a plurality of bits, the circuit comprising:
   an input terminal for receiving a signal;
   a plurality of first delay elements, each having a delay that embodies a bit of the plurality of bits, the plurality of first delay elements being coupled to the input terminal; and
   a plurality of storage devices having first inputs that receive the binary code from the first delay elements as delayed versions of the signal, wherein the binary code is stored in the plurality of storage devices in response to receiving a delayed version of the signal at second inputs of the plurality of storage devices.

7. The circuit of claim 6, wherein the second inputs are clock inputs, and further comprising a second delay element coupled to the clock inputs of the plurality of storage devices.

8. The circuit of claim 7, wherein the second delay element is coupled to the input terminal.

9. The circuit of claim 8, wherein the second delay element comprises a delay approximately an average of the plurality of first delay elements.

10. The circuit of claim 6, wherein the plurality of storage devices are flip-flops, and wherein the first inputs are D-inputs or inverted D-inputs.

11. The circuit of claim 6, wherein outputs of the plurality of storage devices provide the binary code to an output terminal in response to receiving the signal at the input terminal.

12. The circuit of claim 6, wherein the binary code does not change after manufacturing of the circuit.

13. The circuit of claim 6, wherein the binary code is stored in the plurality of storage devices substantially simultaneously, in response to the plurality of storage devices receiving the delayed version of the signal at the second inputs.

14. A circuit for encoding a binary code, the binary code comprising a plurality of bits, the circuit comprising:
   an input terminal for receiving a signal;
   a plurality of first delay elements that each denotes a bit of the plurality of bits of the binary code as a respective delay of each of the plurality of first delay elements, the plurality of first delay elements being coupled to the input terminal; and
   a plurality of storage devices that receive the binary code from the plurality of first delay elements and provide the binary code at outputs of the plurality of storage devices in response to receiving a delayed version of the signal.

15. The circuit of claim 14, further comprising a second delay element coupled to the input terminal and the plurality of storage devices, wherein the delayed version of the signal is received via the second delay element.

16. The circuit of claim 15, wherein respective delays of the first delay elements greater than a delay of the second delay element denote logic low bits of the binary code.

17. The circuit of claim 15, wherein the second delay element comprises a delay approximately an average of the delay of the plurality of first delay elements.

18. The circuit of claim 14, wherein the storage devices are flip-flops.

19. The circuit of claim 14, wherein the binary code does not change after manufacturing of the circuit.

20. The circuit of claim 14, wherein each bit of the binary code is provided at the outputs of the plurality of storage devices substantially simultaneously.

* * * * *